United States Patent
Kin-Wing et al.

(10) Patent No.: US 6,618,263 B1
(45) Date of Patent: Sep. 9, 2003

(54) QUICK RELEASE HOLD-DOWN FOR PCI/AGP CARDS

(75) Inventors: Ko (Kevin) Kin-Wing, Redwood City, CA (US); John W. Toor, Palo Alto, CA (US); Andrea Koerselman, Mountain View, CA (US); Livius D. Chebeleu, San Jose, CA (US)

(73) Assignee: Flextronics Design, San Jose, CA (US)

( * ) Notice: Subject to any disclaimer, the term of this patent is extended or adjusted under 35 U.S.C. 154(b) by 0 days.

(21) Appl. No.: 09/946,860

(22) Filed: Sep. 4, 2001

(51) Int. Cl.[7] .................................................. H05K 7/12
(52) U.S. Cl. ..................... 361/759; 361/732; 361/801; 361/825; 211/41.17
(58) Field of Search ................................ 361/726, 732, 361/740, 752, 753, 759, 796, 797, 801, 802, 825; 211/41.17

(56) References Cited

U.S. PATENT DOCUMENTS

| | | | | |
|---|---|---|---|---|
| 5,601,349 A | * | 2/1997 | Holt | 174/67 |
| 5,694,291 A | * | 12/1997 | Feightner | 361/683 |
| 5,936,835 A | * | 8/1999 | Astier | 361/683 |
| 5,991,983 A | * | 11/1999 | Kohler et al. | 24/594.1 |

* cited by examiner

Primary Examiner—Jayprakash N. Gandhi
(74) Attorney, Agent, or Firm—Haverstock & Owens LLP

(57) ABSTRACT

A quick release hold-down mechanism for releasably securing protective covers and expansion cards within a personal computer comprises a press plate for exerting a force upon the flange of a protective cover or the flange of an expansion card. A tension arm is operatively coupled to the press plate for holding the press plate in place. The tension arm is releasable to and securable within a fixed position such that the press plate maintains the force upon a surface of the expansion card or protective cover to maintain the expansion card or protective cover in its desired location. The tension arm is rotatably moved which causes the press plate to pivot through an arc, around a pivot means. By this rotatable motion of the tension arm, the press plate engages the surface of the installed protective cover or expansion card. More than one protective cover and expansion card can be installed and any number of either or both can be thus secured. The tension arm is secured by means of a locking indent that engages the computer chassis.

18 Claims, 11 Drawing Sheets

QUICK RELEASE HOLD-DOWN FOR PCI/AGP CARDS

BACKGROUND OF THE INVENTION

1. Field of the Invention

The present invention relates to the field of releasably securing PCI/AGP cards into their connectors within a computer. More particularly, the present invention relates a single hold down member that is quickly releasable, quickly re-secured, and capable of simultaneously securing a plurality of expansion cards within their respective connectors.

2. Description of the Prior Art

PCI/AGP cards, or "expansion" cards are used by computers to interface with some external device. Common expansion cards include SCSI ports, serial ports, parallel ports, external drive ports, modems, and video cards. Because such expansion cards often allow coupling an external device to the expansion card, there is typically an opening in the computer chassis from within the computer to outside the computer. When no expansion card is installed, a protective cover, typically sheet metal, covers the opening. This protective cover serves a variety of functions, including the prevention of electromagnetic noise from escaping the chassis, the prevention of dust and debris from accumulating within the computer, and shielding the electronic componentry from outside objects, and protecting consumers from electrical shock through contact with exposed componentry. FIG. 1 schematically illustrates protective metal covers 100 adjacent to the connectors 104 in which expansion cards are electrically coupled to an electronic system, such as a personal computer. The metal covers 100 typically comprise a flange 108 for engaging a surface of a chassis (not shown) in the usual manner. The flange 108 typically includes a slot 102 or screw hole where a screw 106 secures an individual cover 100 to the computer chassis.

FIG. 2 shows an expansion card 204 mounted in a connector 206. A protective cover 202 dimensionally similar to the protective cover 100 of FIG. 1 is coupled with the expansion card 204, thereby forming a face piece 202 of the expansion card 204. The protective cover or face piece 202 comprises a flange 212 and an upright member 214. Like the protective covers 100 used in shielding an unused slot, the face piece 202 of an expansion card 204 is typically made from sheet metal. Again, it is noted that the expansion card is secured by means of a screw 210 inserted through a hole or slot 208 in the flange 212 of the face piece 202.

Prior art uses of metal covers 100 and expansion cards that include an integral metal face piece 202 suffered from a number of limitations. The process of installation and/or removing the such metal covers 100 and/or expansion cards 204 was labor intensive. An installer must loosen, remove and/or install screws 106, 200, 210. Such a practice undesirably increases the cost of manufacturing a computer system and also the cost of upgrading a system by adding an expansion card 204 in an after market improvement of the personal computer. These and other problems are exacerbated owing to the relative tiny size of the screw 106, 210.

The steps typically required in the installation of a screw according to the prior art is illustrated in FIG. 3. According to the step 302, the worker must locate the tiny screw among components in his work area. In an assembly line environment with a bowl of screws in front of a worker, this step may require minimal time or concentration. In a repair environment where numerous screws, nuts, washers and other components may be spread about a work area, the delay may run from several seconds to a minute or more. According to steps 304 and 306, the worker picks up the screw and orients it in his fingers. In the step 308, the worker lines up the screw with the hole or notch in which it is to be inserted. In the step 310, the screw is inserted into the hole. In the steps 312 and 314, the worker picks up the screw driver with his free hand and inserts it into the screw driver head. In the step 316, the screw is tightened into place. If the worker is installing a PCI/AGP card, as a result of the connector, the card may stand upright on its own during the installation of the screw. In the installation of a protective cover, the worker may have to secure the protective cover with a few fingers, while holding the screw with several more, and using the other hand to wield the screw driver.

For each computer, the delay involved in inserting a screw is multiplied by the number of slots that are being loosened or tightened to install, remove, replace or inspect expansion cards. When multiplied by the assembly or repair of millions of computers, this represents a significant amount of time and a corollary loss of profits. Moreover, unscrewing and tightening screws requires a proper tool, and proper lighting. Although this may not be a problem on an assembly line environment where a worker is equipped with proper tools, for consumers adding or replacing expansion cards at home, locating a screwdriver and proper lighting may take anywhere from several minutes to a trip to the hardware store. For factory workers and consumers alike, the prospect of dropping a screw into the computer simply exacerbates the delays, particularly if the screw is difficult to retrieve. Occasionally, damage to a mother board may result from attempts to retrieve a lost screw. Further, the repetitive action of unscrewing and screwing can also result in a repetitive motion injury to an installer.

An attempt to address some of the problems inherent in the prior art was made by Micron technology in the development of a hold-down mechanism for multiple PCI/AGP cards, illustrated in FIG. 4. A tension arm 402 made from a rigid and flexible material is attached to a press plate 408. Typically, the tension arm is made from a rigid and flexible material such as sheet metal. The tension arm includes a bent flanged tab 404 which includes a hole 412 and a thumb screw 414 for locking the tension arm 402 in place. When in place, a pressing plate 408 portion of the construction is advantageously positioned against a free edge of one or more PCI/AGP cards. The tension arm 402 is ideally flexed through compression, thereby securing the pressing plate 408 against PCI/AGP cards. For structural integrity, a rigid support member 406 typically couples the press plate 408 to the tension arm 402. The rigid support member 406 is seen to extend across the lateral front edge of the press plate 408, providing strength and rigidity to the press plate 408 when engaging PCI/AGP cards, as further illustrated in subsequent drawings. As can be seen from FIG. 4, the tension arm 404, rigid support member 406 and press plate 408 are advantageously constructed from a single sheet of metal, thereby minimizing costs associated with manufacturing. When the thumb screw 414 is loosened, releasing the tab 404 from the computer chassis, the hold-down 400 pivots around a fixed point as further illustrated below.

FIGS. 5A and 5B show the operation of the Micron hold-down mechanism for securing multiple PCI/AGP cards. In FIG. 5A the Micron hold-down 400 is seen swivelled to the release position. In the released position, a user may remove and install PCI/AGP cards 204 or protective covers 100. In FIG. 5B, the tab of the hold down 400 is secured to the computer chassis 602 by means of the thumb screw 414. When the thumb screw 414 is screwed into a threaded hole 606 in the computer chassis 602, the press plate 408 is pressed against the flange 212 of the face piece 202 on the PCI/AGP card 204, thereby holding the PCI/AGP card 204 securely in the connector 206.

Although the thumb-screw hold down afforded some advantages over the prior art in terms of speed, it nevertheless retains numerous shortcomings. For a thumb screw 414 to be useful, it typically must have a knurled or tooled finish around the outer diameter of screw head, providing a texture which allows a user to grip the screw head. Because of the quality of machining, a knurled thumb screw 414 is substantially more expensive than the cost of a cheaply manufactured screw 106, 200, 210 seen securing PCI/AGP cards in FIGS. 1 and 2. Another weakness with a thumb screw for securing a hold-down is that, as with individual screws, a thumb screw can be lost. This hazard can be reduced by utilizing a screw with a shoulder so that it cannot fall out. Again, however, this convenience is only achieved at the expense of more complex and costly designs on the thumb screw and tapped hole. A further limitation of a thumb screw type hold down is that the hole 606 in the computer chassis must be threaded to accommodate a thread of a thumb screw. Because the thumb screw must be configured to be reliably inserted and removed repeatedly, and in light of the force needed to tap a hole, which may be hard to generate by holding a thumb screw between a thumb and forefinger, a self tapping screw is generally impractical. However, preparing a pre-tapped hole during the manufacture of the chassis again increases costs in tooling and assembly. Yet another limitation of a thumb screw type hold down is the time required to rotate the thumb screw into and out of its threaded aperture. Screwing and unscrewing require multiple twists of the assembler's fingers, delaying production time. This is particular true in examining FIGS. 5A and 5B. To begin the process an assembler would have to align the thumb screw 414 to the threaded aperture 412. This alignment can be even more difficult in light of the fact that the tension arm 402 should be under a certain amount of tension to securely hold the PCI/AGP cards. To impart this tension to the tension arm 402, the threaded hole 606 in the chassis would have to be slightly lower than the hole 412 in the tab 404, such that aligning the two holes imparts a slight tension on the tension arm 402. All of these factors contribute to a delay, in aligning and screwing in the thumb screw during the assembly process. A reduction in manufacturing time or expense of parts is desired for maintaining a competitive edge in the manufacture of personal computers.

There exists therefore a need for a method and apparatus for releasably securing a plurality of expansion cards simultaneously within their respective connectors, thereby avoiding the need for separate installation steps. There further exists a need for a method and apparatus that can secure a plurality of expansion cards that avoids the need for tooling or tapping threads into a computer chassis. There further exists a need for a method and apparatus for securing a plurality of expansion cards within their respective connectors that avoids the need for screws that can easily be lost or misplaced. There further exists a need for a method and apparatus for securing a plurality of expansion cards within their respective connectors that avoids the need of expensive knurled thumb screws. There further exists a need for a method and apparatus for securing a plurality of expansion cards within their respective connectors that avoids the expenditure of assembly time in aligning a screw with a threaded hole, and further eliminates the expenditure of assembly time devoted to performing the repetitive motion of screwing in a screw to perform installation. There further exists a need for a quick release multi-card securing device that can be manufactured and installed at low cost, thereby addressing a critical market concern of computer manufacturers.

BRIEF SUMMARY OF THE INVENTION

The present invention discloses a method and apparatus for releasably securing a plurality of PCI/AGP cards simultaneously within their respective connectors, thereby avoiding the need for separate installation steps. The PCI/AGP cards can comprise SCSI ports, serial ports, parallel ports, external drive ports, modems, and video cards. It will be readily recognized that such expansion cards are not intended to limit the scope of this discussion. Rather, the invention is intended to contemplate rapid installation of any electronic circuit board. However, for simplicity of this disclosure, the invention is described in terms of PCI/AGP cards.

The present invention further discloses a method and apparatus for securing a plurality of PCI/AGP cards in a manner without the need for tooling or tapping threads into a computer chassis. The present invention further discloses a method and apparatus for securing a plurality of PCI/AGP cards within their respective connectors that avoids the need for screws that can easily be lost or misplaced. The present invention further discloses a method and apparatus for securing a plurality of PCI/AGP cards within their respective connectors that avoids the need of expensive knurled thumb screws. The present invention further discloses a method and apparatus for securing a plurality of PCI/AGP cards within their respective connectors that avoids the expenditure of assembly time in aligning a screw with a threaded hole, and further eliminates the expenditure of assembly time devoted to performing the repetitive motion of screwing in a screw to perform installation. The present invention further discloses a quick release multi-card securing device that can be manufactured and installed at low cost, thereby addressing a market concern of computer manufacturers.

A quick release hold-down mechanism releasably secures a plurality of components within a computer chassis. The components may variously include protective covers positioned to cover expansion slots, and PCI/AGP cards properly inserted in their respective connectors. The quick release hold-down mechanism comprises a press plate for exerting a force to hold the PCI/AGP card into its connector; a tension arm operatively coupled to the press plate for holding the press plate in place, and a locking indent in the tension arm. The locking indent is configured to engage the computer chassis when the quick release hold-down mechanism is in a secure position, such that the press plate is substantially positioned to exert a force on a surface of either a protective cover or of a PCI/AGP card properly seated within a connector. The tension arm comprises a material that is capable of deforming and restoring when the locking indent engages and disengages the computer chassis. The quick release hold down mechanism comprises a pivot member around which the press plate pivots.

DETAILED DESCRIPTION OF THE PREFERRED EMBODIMENT OF THE INVENTION

The embodiments recited herein are neither intended to limit the scope of the invention, nor to exhaust every possible variation or nuance of the described invention. Minor variations of the disclosed invention will immediately become apparent to those skilled in the art after reading and studying this disclosure. Accordingly, the figures and detailed description recited herein are merely intended to illustrate a particular implementation of the present invention, and to enable those skilled in the art to utilize the principles of the invention set forth herein.

Figure 6:
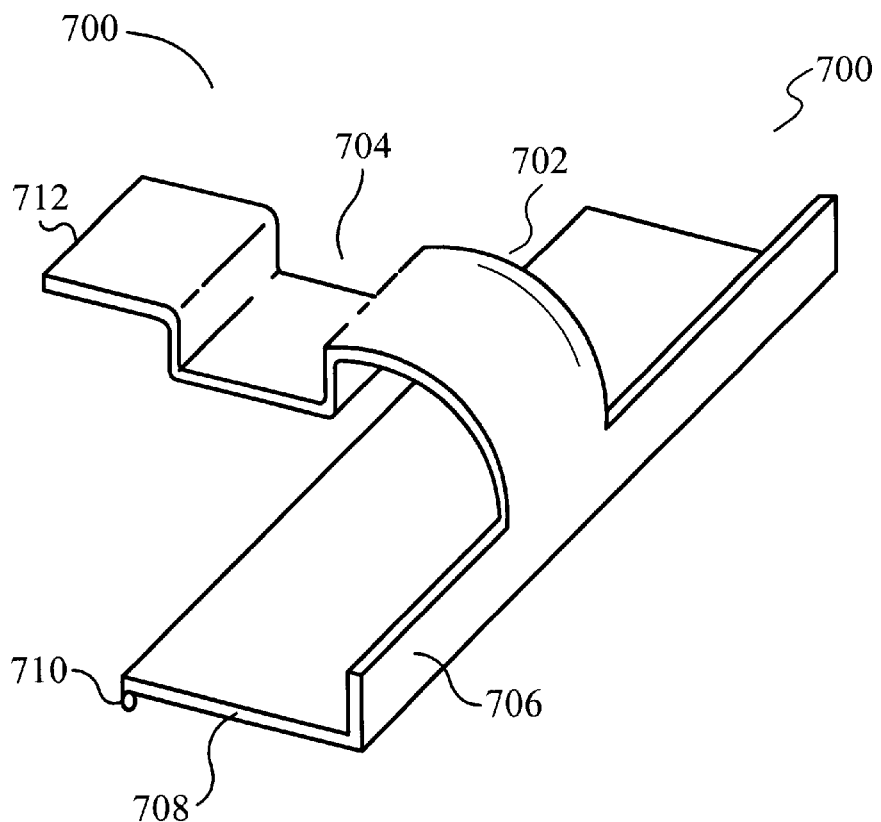
FIG. 6 is one embodiment of a quick release hold-down mechanism according to the present invention.

FIG. 6 is one embodiment of a quick release hold-down for multiple PCI/AGP cards, and other similar "expansion cards" which are secured within a computer. A tension arm 702 made from a tensile material such as sheet metal. The tension arm 702 is operatively coupled with a press plate 708. Preferably, the tension arm 702 attaches to the press plate 708 through a rigid support member 706 which extends across the lateral front edge of the press plate 708, providing strength and rigidity to the press plate 708 when engaging PCI/AGP cards, as further illustrated in subsequent drawings. As can be seen from FIG. 6, the tension arm 702, rigid support member 706 and press plate 708 are advantageously integrally constructed from a single sheet of metal, thereby minimizing costs associated with manufacturing. The assembly include the tension arm 702, rigid support member 706 and press plate 708 can be stamped from a sheet metal blank to minimize construction costs.

According to the preferred embodiment, the quick release hold-down 700 pivots on a pivot 710. According to one embodiment, the pivot 710 is a hinge affixed to the chassis wall, as further illustrated in FIG. 8A and 8AB The tension arm 702 locking indent 704 and finger-tab 712 preferably comprised a single continuous member which is formed into a locking indent and finger-tab through a manufacturing process such as stamping. Although the tension arm 702 may be made of any tensile material, it must be capable of deforming and restoring to its original shape, as would be achieved by metal with a spring quality.

Figure 7:
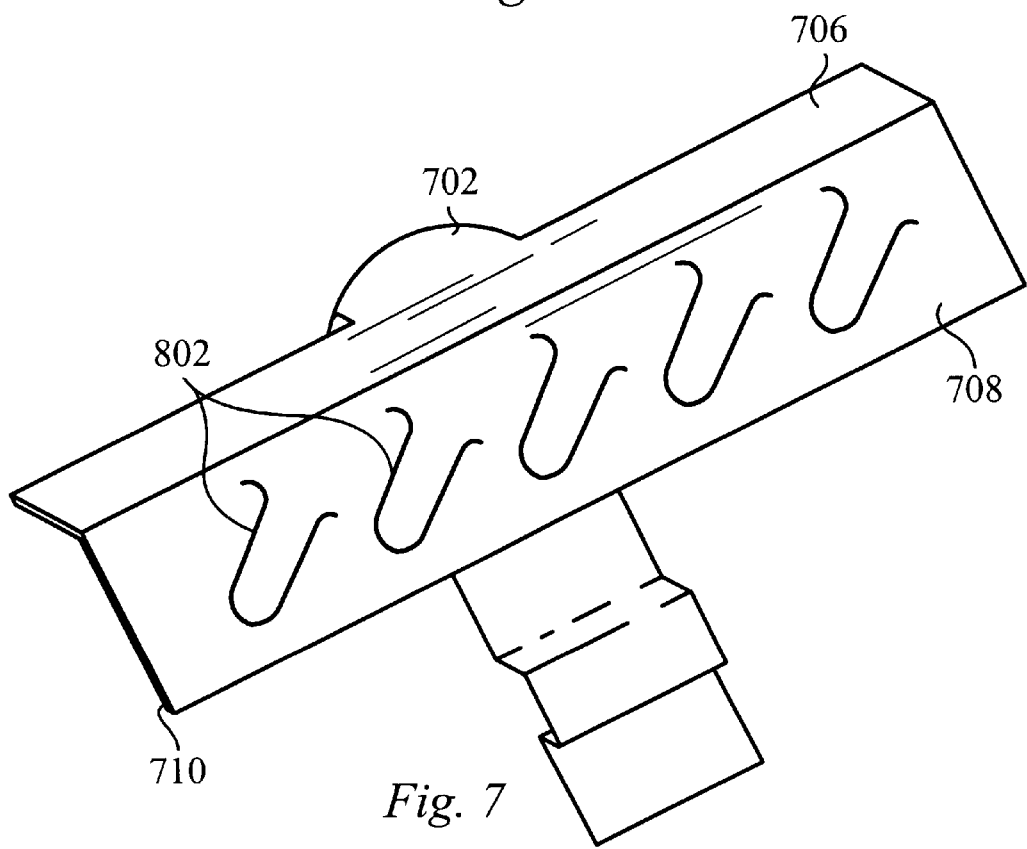
FIG. 7 is an embodiment of the quick release hold-down mechanism according to the present invention incorporating pressure springs.

Because the flat metal surface of the quick release hold down mechanism must ideally exert a pressure on a plurality of flanges, any slight irregularity in the contour of the press plate 708, or slight variations in length of face plates or the angle of a flange may result in less than optimum pressure against a flange 108, 212. To ensure a uniform pressure against a plurality of flanges, the preferred embodiment envisions deformable pressure members disposed along the press plate 708. FIG. 7 illustrates optional deformable pressure members 802 mounted on the press plate 708. According to the preferred embodiment, the deformable pressure members 802 are formed from the press plate surface itself. A stamping or cutting operation cuts the press plate into a plurality of finger like extensions which are bent downward to form the spring pressure members 802 pictured in FIG. 7. The deformable pressure members 802 are preferably spaced at a distance equal to the manufacturing distance between expansion slots, such that one spring pressure member is allocated to press upon a respective expansion card when installed. Alternative embodiments are envisioned, however, including but not limited to the use of a deformable elastomer such as foam rubber affixed to the bottom of the press plate 708 to help maintain pressure against the flanges 212 of all of the PCI/AGP cards and/or flanges 108 of the face plates 100, or wire loops affixed to the press plate. By using deformable pressure members 802, manufacturing tolerances for the press plate assembly can be relaxed while maintaining a uniformity of pressure among plurality of expansion cards or protective covers.

Figure 8A:
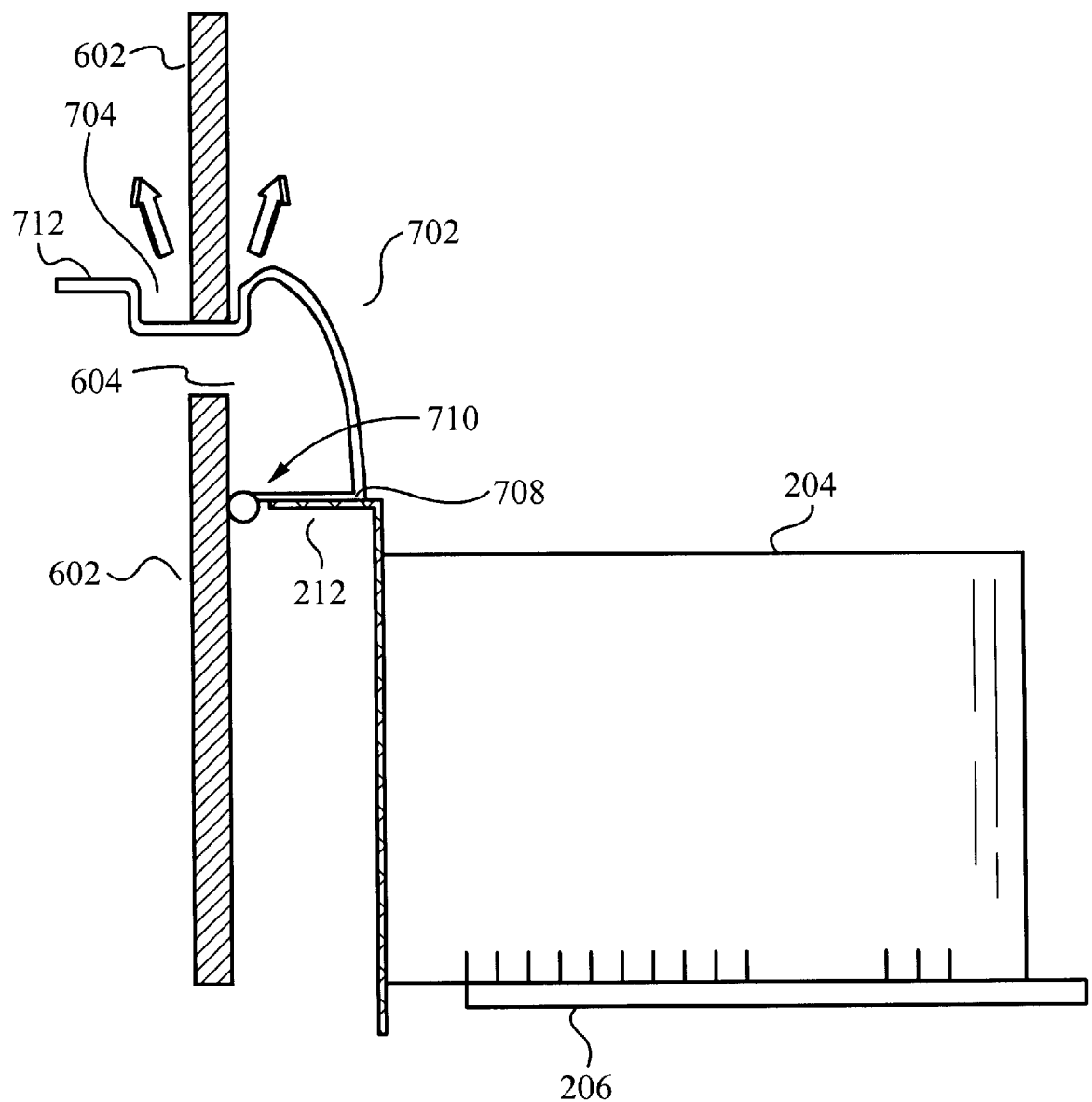
FIG. 8A is an illustration of a quick release hold-down mechanism securing a PCI/AGP expansion card according to one embodiment of the present invention.
Figure 8B:
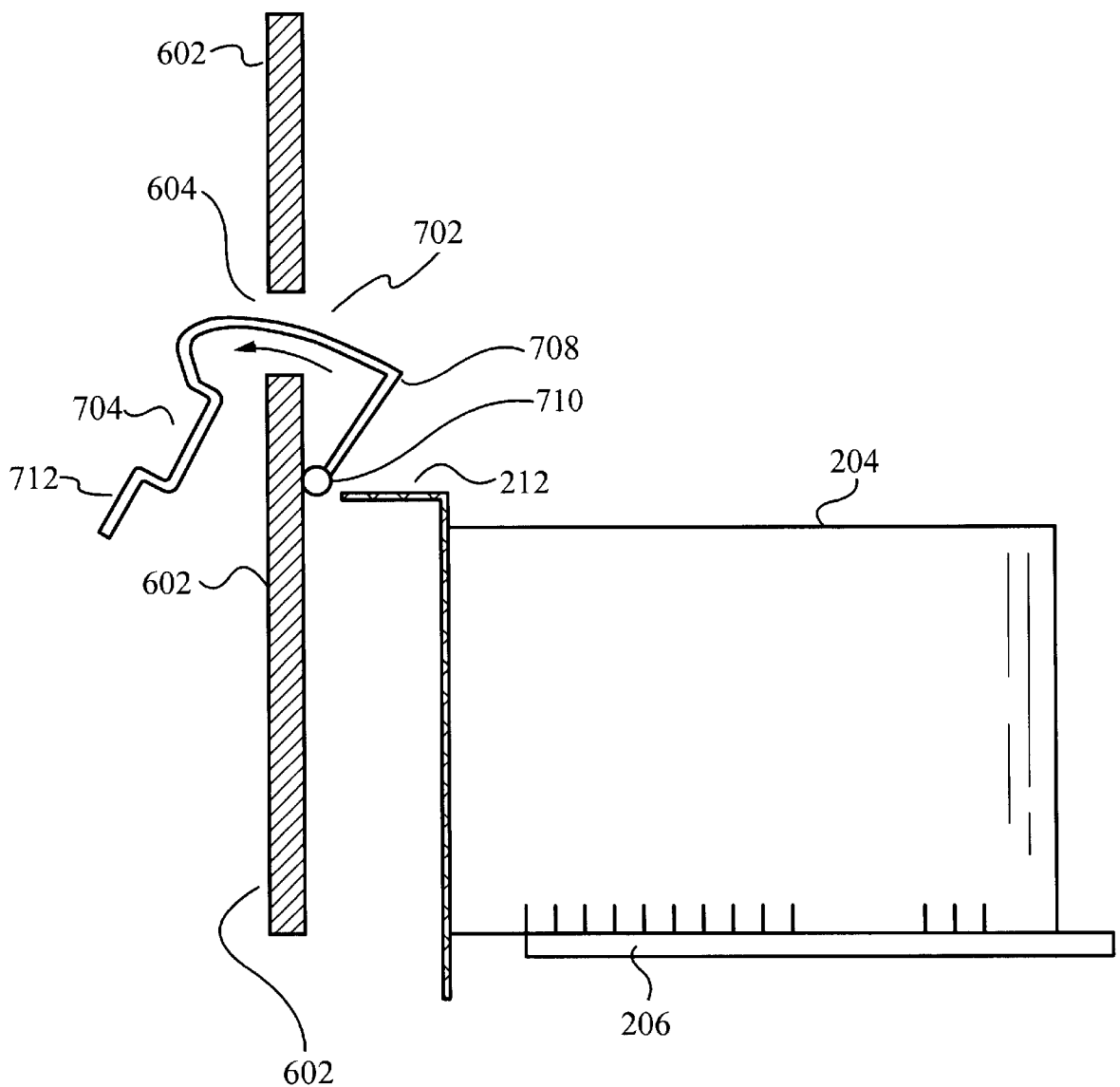
FIG. 8B illustrates a quick release hold-down mechanism in the released state according to one embodiment of the present invention.
Figure 9A:
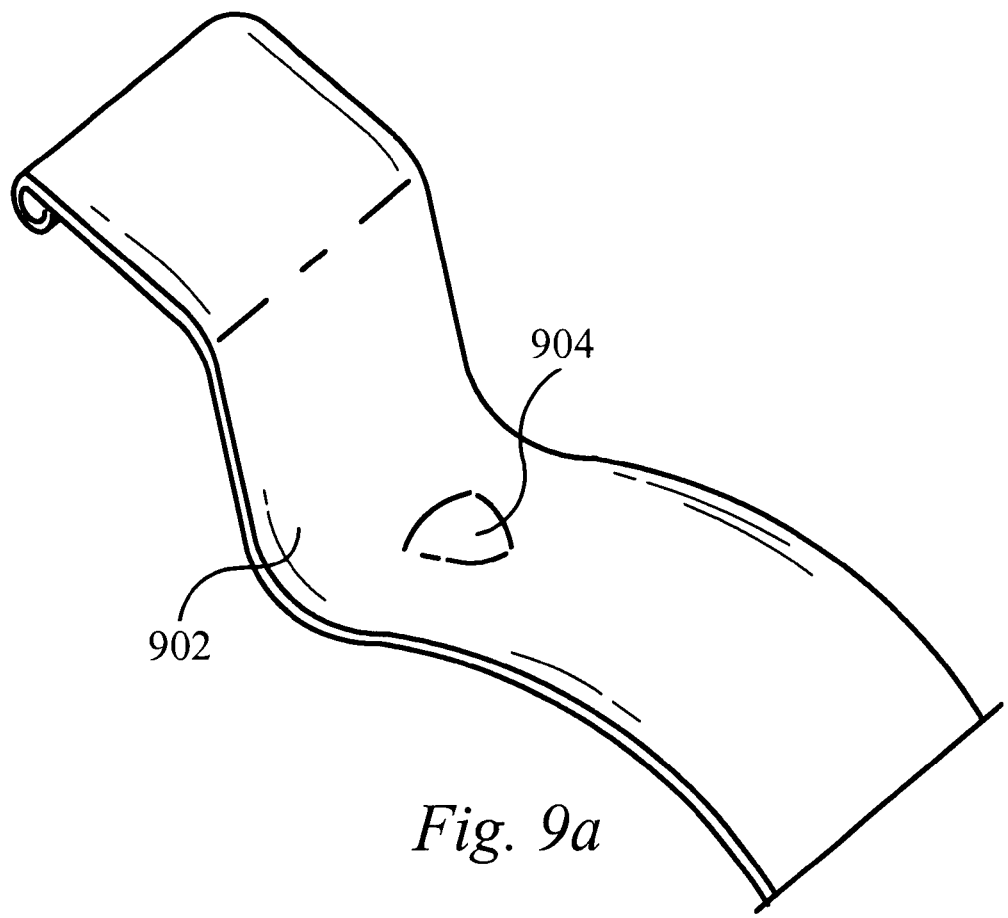
FIG. 9A is an embodiment of the present invention with a locking indent comprising a curved well and half moon indent.
Figure 9B:
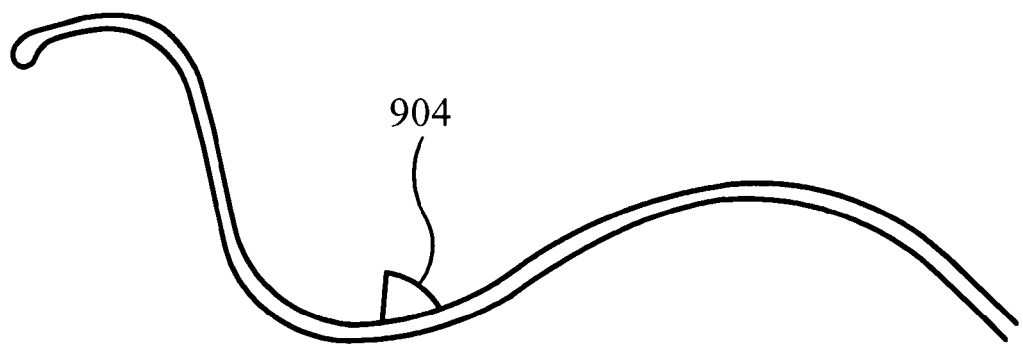
FIG. 9B is an alternative view of a locking indent with a curved well and half moon indent.
Figure 9C:
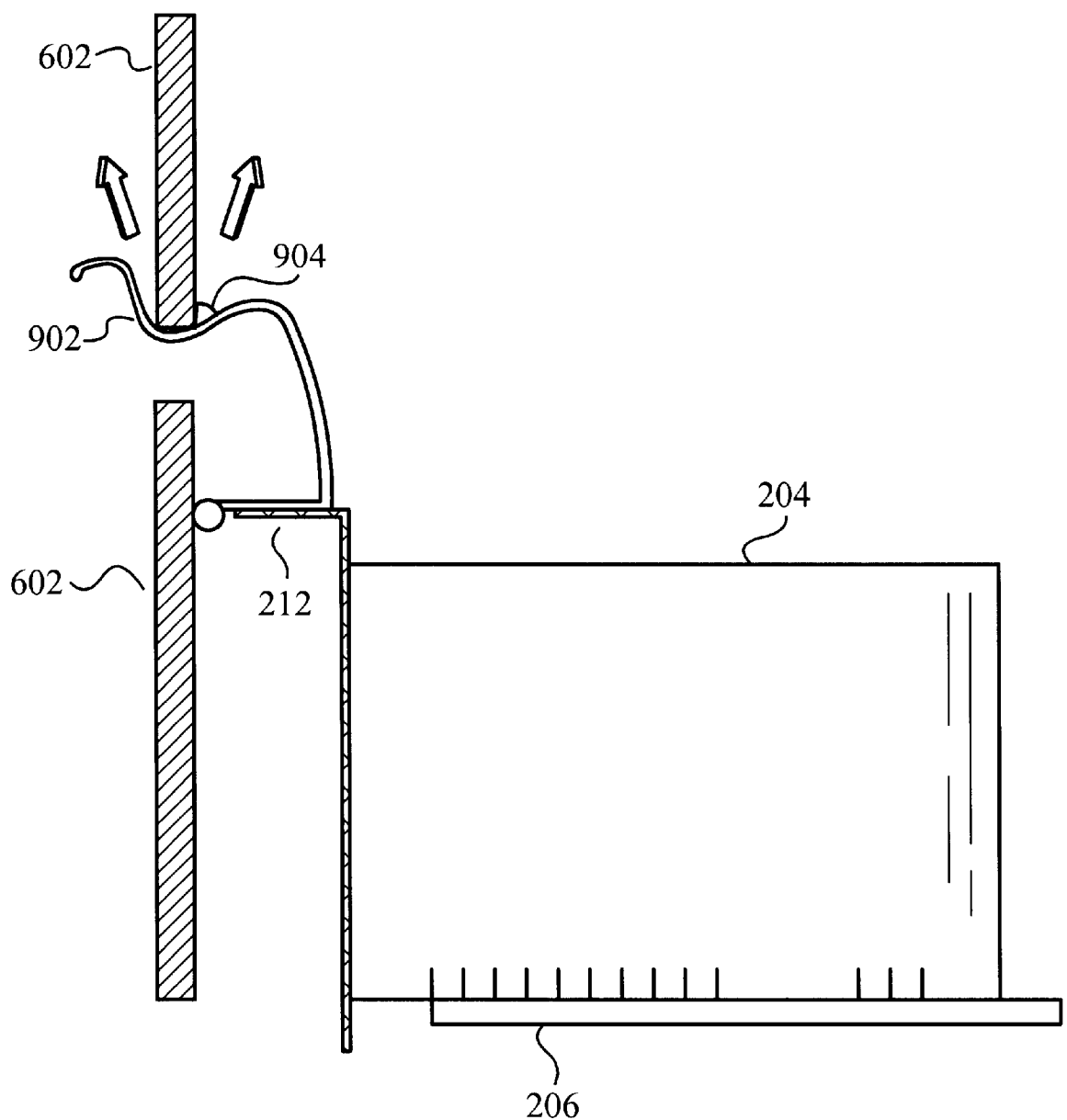
FIG. 9C is a curved well with half moon indent engaging a chassis member.

The quick release hold-down mechanism is held in place by means of a locking indent, or a plurality of locking indents. FIGS. 8A and 8B depict one embodiment of a locking indent in the form of a square-indent-lock. FIGS. 9A, 9B and 9C depict an alternative embodiment of a locking indent comprising a rounded well 902 with a machine stamped "half moon" indent 904. It is understood that the present invention is intended to utilize any shaped locking indent which holds the tension arm 702 in place, including curved indents, V-shaped indents, square indents, stamped half moon indents, or any other shape, and that the particular indents depicted in FIGS. 8A, 8B, 9A, 9B and 9C illustrate these particular embodiments for exemplary purposes only. It is further envisioned that multiple indents could be used to form a ratcheted surface for adjusting the tension with which the quick-release hold down mechanism presses against the flanges of the components being secured. Accordingly, the essential feature of the quick release lock is that when a force transmitted through the quick release hold down mechanism is transmitted into the computer chassis 602, an indent within the tension arm 702 locks the portion of the computer chassis 602 against the tension arm 702. The computer chassis 602 is held within the confines of the indent 704, thereby securing the quick release hold down mechanism. The operation of the locking indent is discussed in conjunction with the square indent seen in FIGS. 8A and 8B. In FIG. 8A, the square indent lock is in the latched position. The force exerted against the chassis 602 is transmitted along the resilient tension arm 702, thereby pressing the press plate 708 against a flange 212 of a PCI/AGP card. Spring tension within the tension arm 702 is seen by arrows representing force which are pushing the tension arm 702 upward against the chassis 602. The preferred material for the tension arm and its assembly is sheet metal. In the secure position, the tension arm 702 cannot easily move since the chassis 602 is secured within the locking indent 704. In the secured position of FIG. 8A, the finger-tab 712 on the tension arm 702 extends through an opening 604 in the chassis to the outside.

The direction and path of motion of the quick release hold down 700 can be understood by comparing FIGS. 8A and 8B. A user engages the finger-tab 712, preferably by grabbing it between the thumb and fingers. The user rotatably pulls the finger-tab 712 outward through the opening 604 in the chassis 602. By pushing slightly downward on the finger-tab while pulling outward, the user pulls the tension arm 702 outward through the hole 604, thereby rotating the pressure plate 708 of the quick release hold-down 700 around a pivot member 710, preferably a hinge, and away from the flange 212 on the PCI/AGP card. The assembly can be sufficiently wide (into the page of the drawing of FIGS. 8A and 8B to accommodate multiple PCI/AGP cards 204. Because punched or stamped metal parts may have sharp edges and possess a potential hazzard to users, according to the preferred embodiment, the finger-tab 712 is configured such that it presents no sharp edges which might pose a hazzard to consumers. In FIG. 8B the quick release hold-down 400 is seen swivelled to the release position. A user may then remove or install a PCI/AGP card 204 or a protective cover 100.

FIGS. 9A, 9B and 9C shows an embodiment of the present invention wherein the tension arm comprises a curved well 902 and half-moon indent 904 which form the locking indent. A half-moon indent 904 can easily be formed in a sheet metal surface by cutting a line in the sheet metal and then stamping the metal to form the half moon indent 904. As illustrated in FIG. 9C, the chassis portion rests securely between an upward curve of the well portion 902 and the half-moon indent 904.

Figure 1:
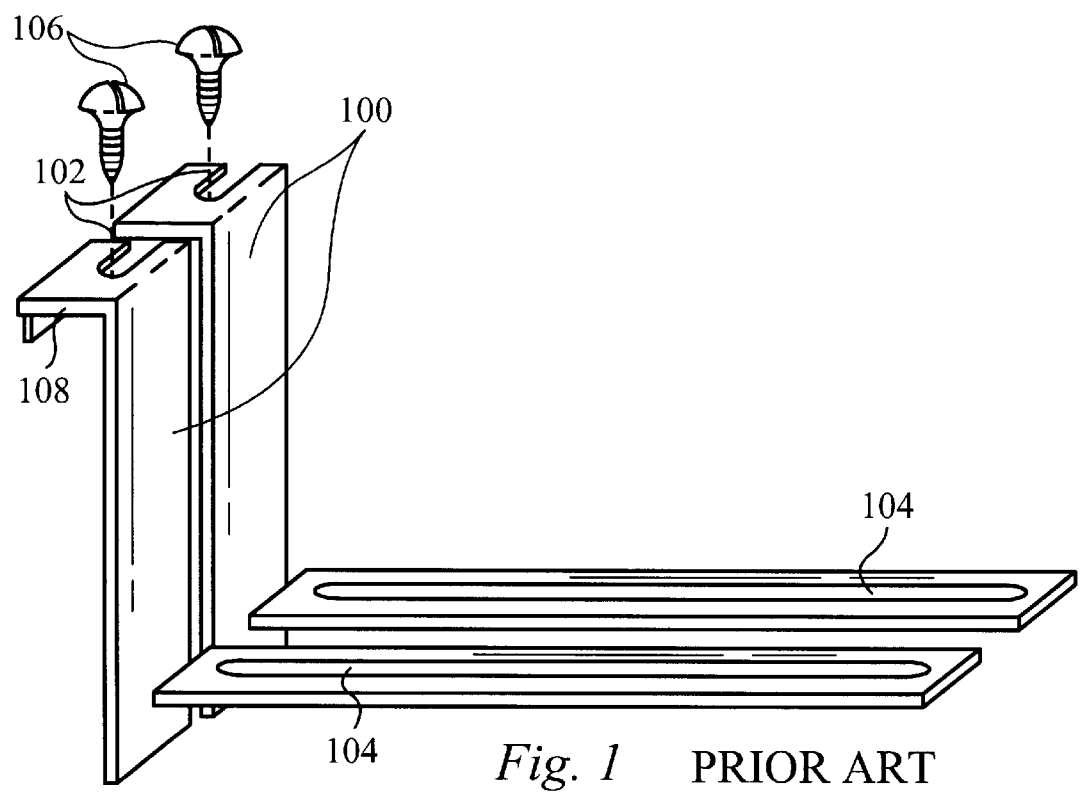
FIG. 1 schematically illustrates protective covers to slots for expansion card with screw for individually securing them according to the prior art.
Figure 2:
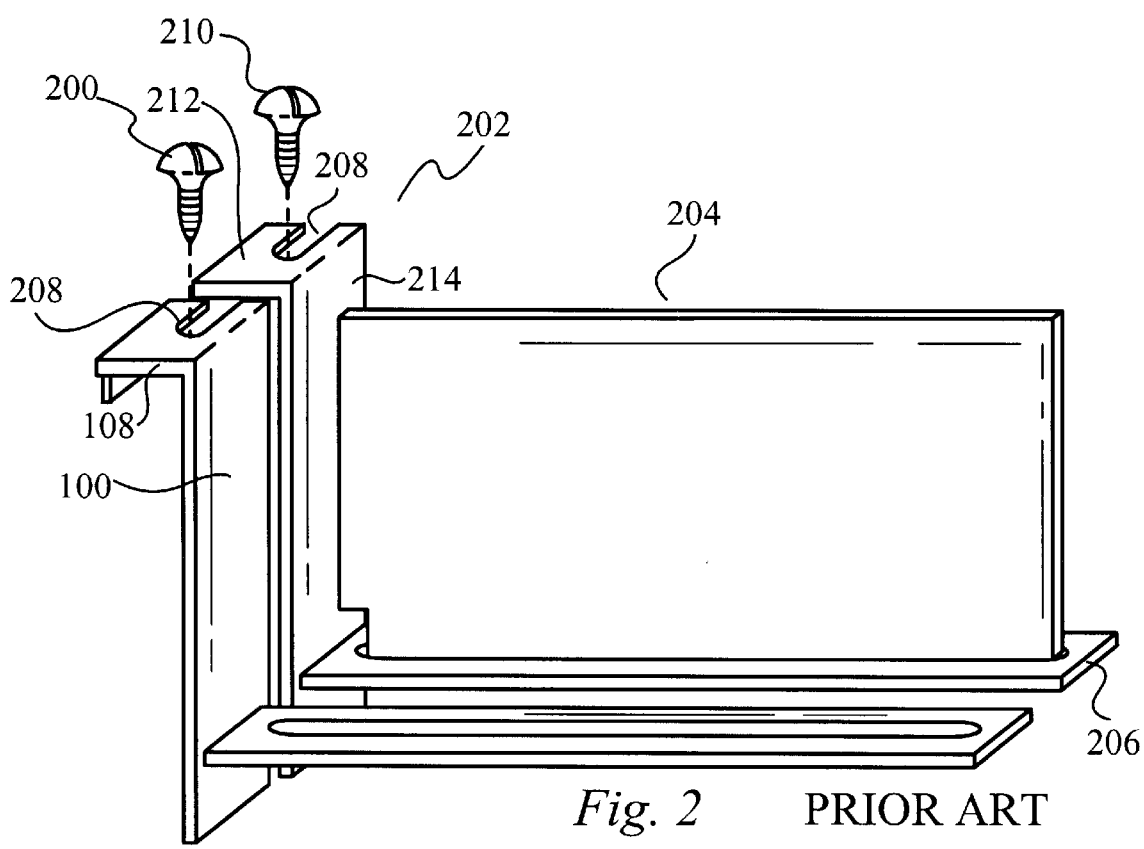
FIG. 2 illustrates a PCI/AGP card with a face piece secured by a screw according to the prior art.
Figure 3:
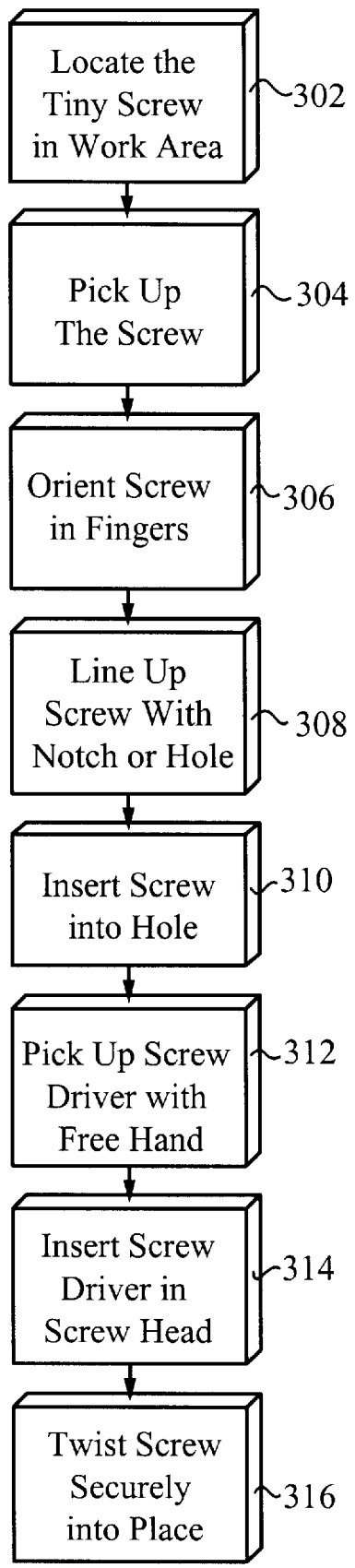
FIG. 3 is a flow chart of the process for securing a PCI/AGP card or protective cover according to the prior art.
Figure 4:
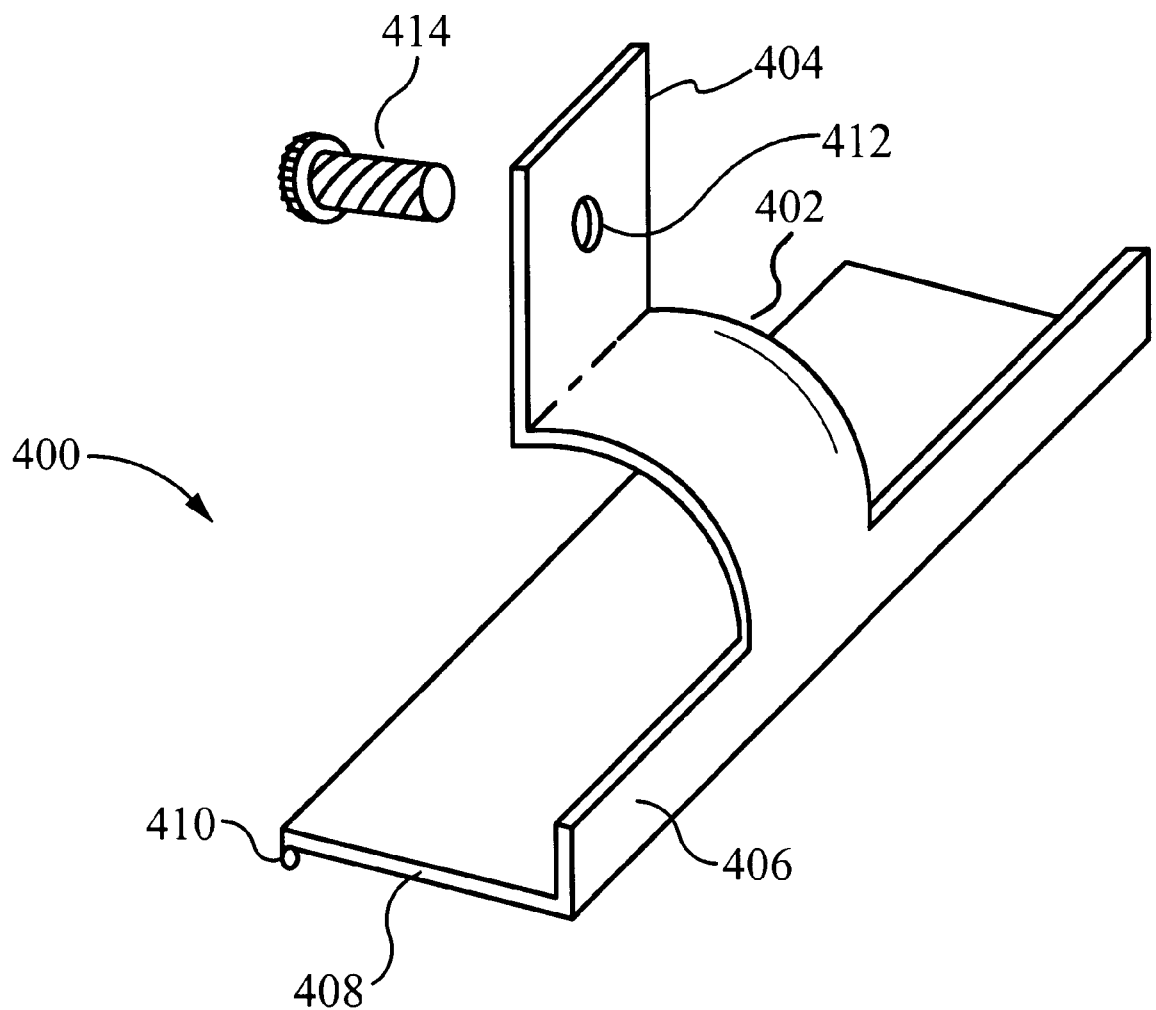
FIG. 4 is a thumb-screw release hold-down mechanism according to the prior art.
Figure 5A:
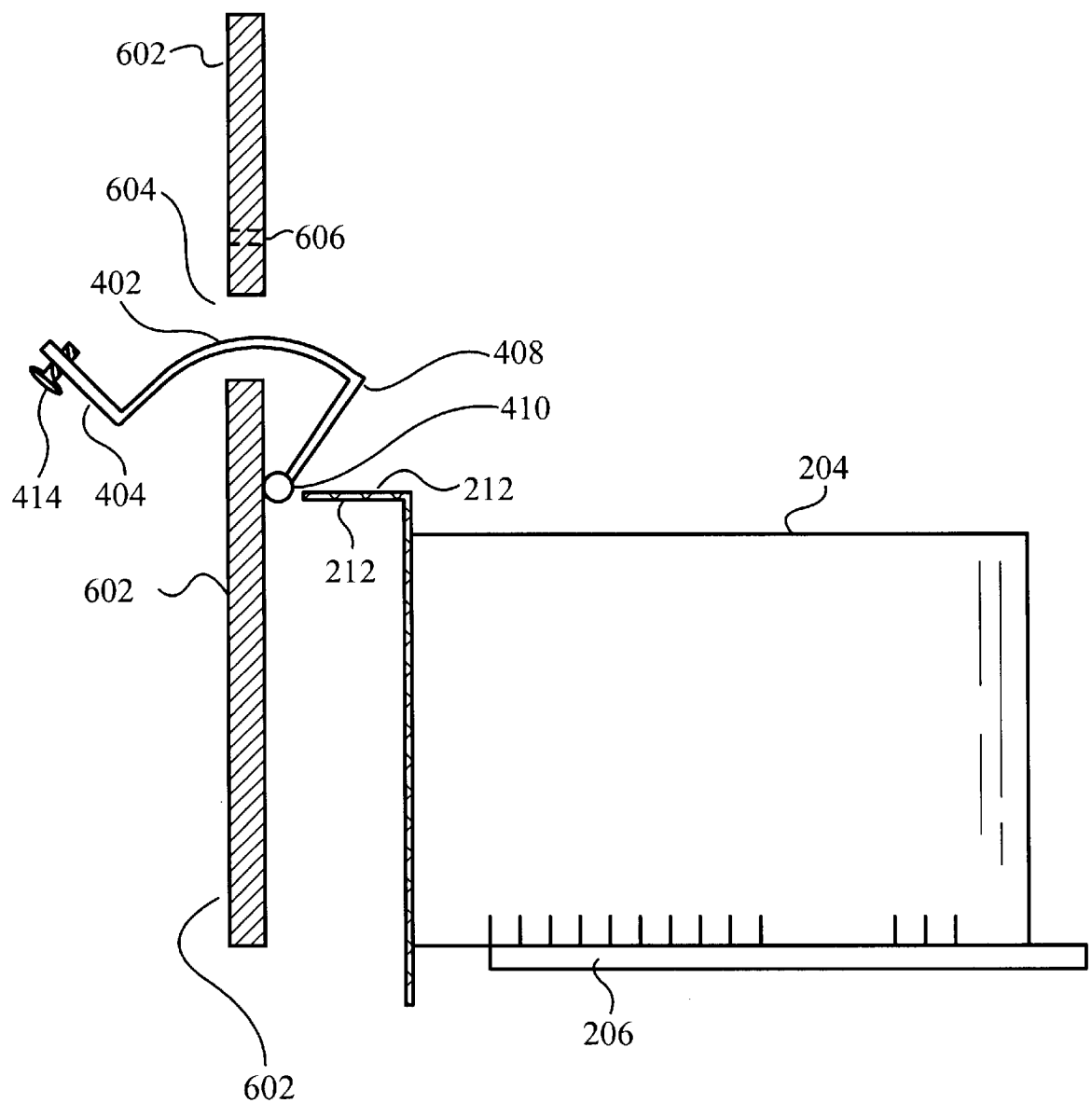
FIG. 5A illustrates a thumb-screw release hold-down mechanism in the released state according the prior art.
Figure 5B:
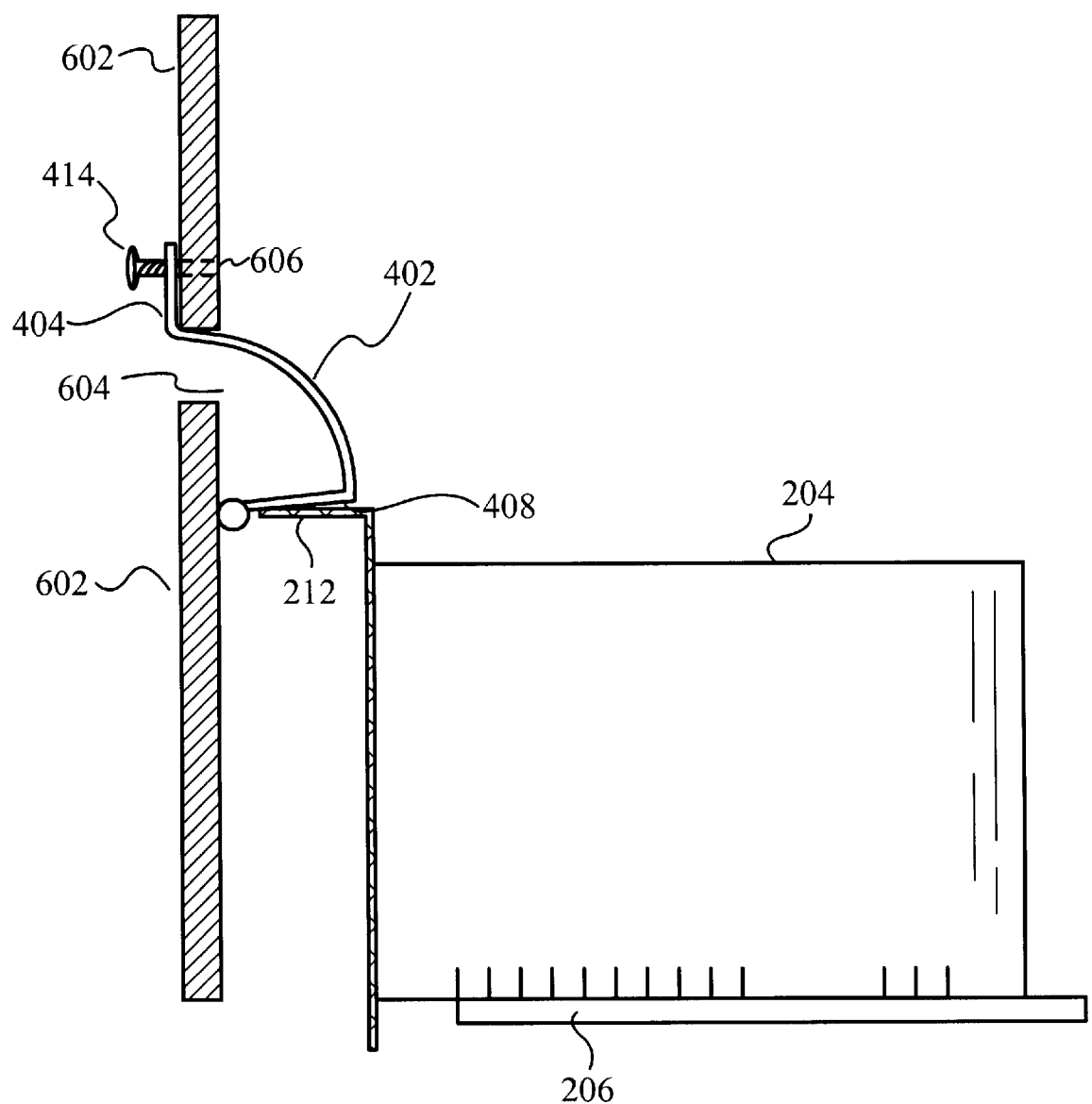
FIG. 5B is an illustration of a thumb-screw release hold-down mechanism securing a PCI/AGP expansion card according to the prior art.
Figure 10:
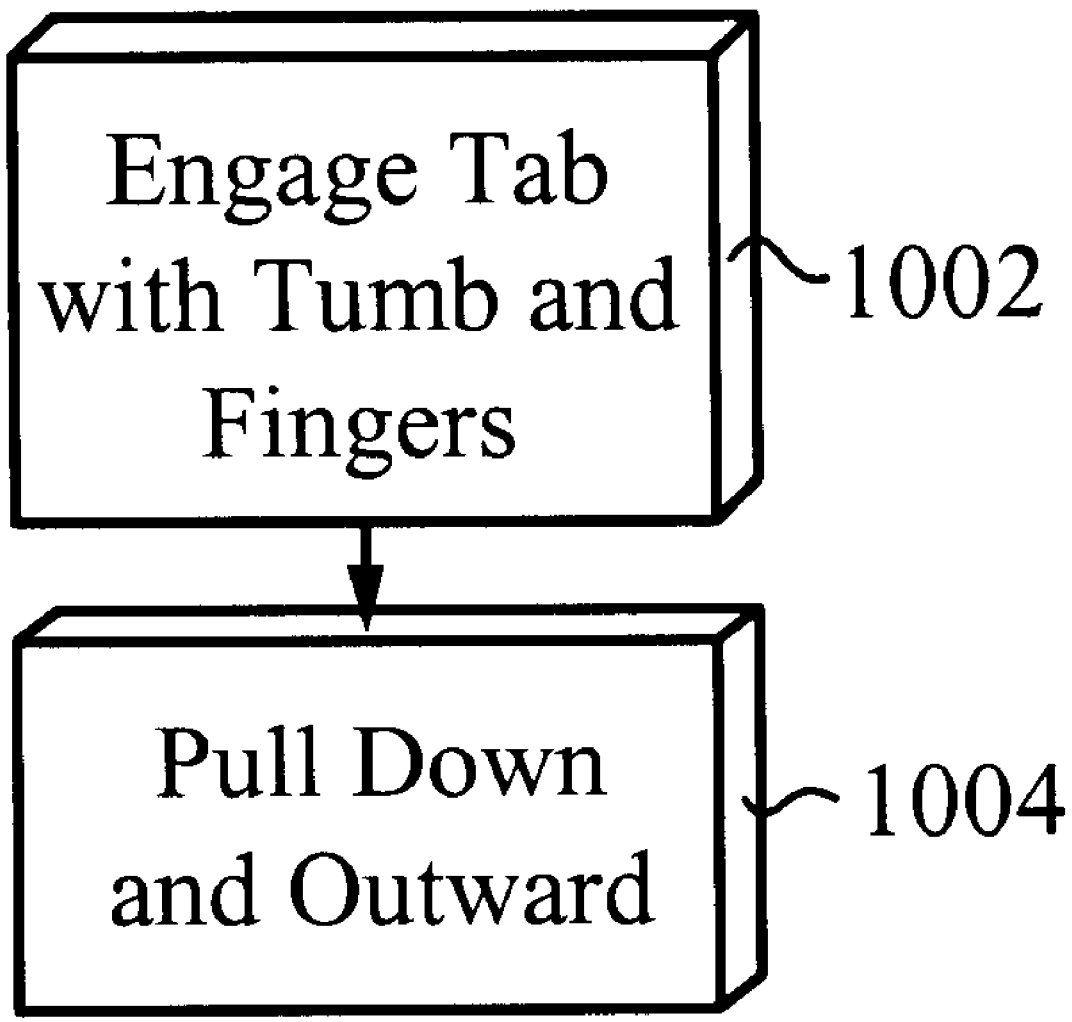
FIG. 10 is a diagram of the steps required to release a quick release hold-down mechanism according to the present invention.

FIG. 10 highlights the extraordinary ease of use of the present invention when contrasted to the prior art, such as seen in FIG. 3. According to step 1002, a user engages the finger-tab, typically between thumb and fingers. In the step 1004, the user pulls on the tab with a force that is outward and slightly downward according to the direction easily discerned by contrasting FIGS. 5A and 5B.

The present invention has been described in terms of specific embodiments incorporating many specific details offered to facilitate an understanding of the principles of construction and operation of the invention. The reference herein to specific embodiments and details thereof are not intended to limit the scope of the claims appended hereto. It will be apparent to those skilled in the art that modifications may be made to the embodiments chosen for illustration without departing from the spirit and scope of the invention.

What is claimed is:

1. A quick release hold-down mechanism for releasably securing a plurality of components within a computer chassis, the components selected from among a group consisting of electronic cards properly inserted in connectors and protective covers, the quick release hold-down mechanism comprising:

a. a press plate for exerting a force upon a flange of a plurality of components;
   b. a tension arm operatively coupled to the press plate for holding the press plate in place; and,
   c. a locking indent formed in the tension arm, the locking indent configured to engage the computer chassis when the quick release hold-down mechanism is in a secure position, such that the press plate is substantially positioned to press downward on a flange, thereby securing a face plate integrally coupled with the flange, the tension arm comprising a material that is capable of elastically bending and restoring when the locking indent engages and disengages the computer chassis.

2. The quick release hold-down mechanism of claim 1 wherein the locking indent is a square shaped indent.

3. The quick release hold down mechanism of claim 1 wherein the locking indent comprises a curved well.

4. The quick release hold down mechanism of claim 3 further comprising a raised half-moon indent within an interior radius of the curved well.

5. The quick release hold-down mechanism of claim 1 wherein the tension arm is comprised of a sheet metal.

6. The quick release hold-down mechanism of claim 1 wherein the tension arm further comprises a finger-tab adjacent the locking member, and wherein the finger-tab protrudes to outside of the chassis through an access way when the locking indent is engaging the computer chassis, such that the finger-tab is accessible to a user and sized such that it is capable of being digitally held by a user.

7. The quick release hold-down mechanism of claim 1 further comprising a pivot member disposed along an edge of the press plate.

8. The quick release hold-down mechanism of claim 7 wherein the pivot member comprises a hinge.

9. The quick release hold-down mechanism according to claim 8 wherein the hinge is rotatably coupled with the chassis wall.

10. The quick release hold-down mechanism according to claim 1 further comprising a rigid support member disposed along the press plate for lending structural integrity to the press plate.

11. The quick release hold-down mechanism according to claim 10 wherein the tension arm is operatively coupled to the press plate through the rigid support member.

12. The quick release hold-down mechanism of claim 1 further comprising a plurality of deformable pressure members disposed on a surface of the press plate and configured to transmit a force from the press plate to a flange of a component.

13. The quick release hold down mechanism according to claim 12 Wherein the plurality of deformable pressure members respectively comprise a shaped portion of the press plate bent downward from a plane defined by the press plate.

14. The quick release hold down mechanism according to claim 13 wherein the plurality of deformable pressure members are spaced apart according to a distance between PCI/AGP slots in a computer such that each deformable pressure member is capable of engaging a different PCI/AGP card.

15. The quick release hold-down mechanism according to claim 12 wherein the plurality of deformable pressure members respectively comprise a deformable elastomer coupled with the press plate.

16. The quick release hold down mechanism according to claim 12 wherein the plurality of deformable pressure members respectively comprise a plurality of wire loops coupled to the press plate and spaced apart according to a distance between PCI/AGP slots in a computer such that each wire loop is capable of engaging a different PCI/AGP card.

17. A method of releasably securing within a computer a plurality of components selected from a group consisting of PCI/AGP cards and protective covers, the method being implemented through a hold-down mechanism comprising a press plate with a pivot, the press plate coupled with tension arm, the tension arm comprising a locking indent coupled with a finger-tab protruding outside of the computer, the method comprising the steps:

d. grasping a finger-tab; and e. advancing the finger-tab in a manner such that the press plate rotates about the pivot until the press plate engages the plurality of components and locks into an operative position.

18. The method according to claim 16 further comprising the step of engaging a locking indent with a portion of a computer chassis.

* * * * *

UNITED STATES PATENT AND TRADEMARK OFFICE
CERTIFICATE OF CORRECTION

PATENT NO. : 6,618,263 B1
DATED : September 9, 2003
INVENTOR(S) : Kin-Wing et al.

It is certified that error appears in the above-identified patent and that said Letters Patent is hereby corrected as shown below:

Title page,
Item [75], Inventors, change inventor "Andrea Koerselman, Mountain View, CA (US)" to -- Andrea Koerselman, San Francisco, CA (US) --.

Column 4,
Line 62, replace "with screw" to -- with screws --.

Signed and Sealed this

Sixth Day of January, 2004

JAMES E. ROGAN
*Director of the United States Patent and Trademark Office*